United States Patent [19]
Maier

[11] Patent Number: 4,956,711
[45] Date of Patent: Sep. 11, 1990

[54] AUTOMATIC BALANCING SYSTEM FOR COMMUNICATIONS RECEIVER APPARATUS

[75] Inventor: Gerhard Maier, Dauchingen, Fed. Rep. of Germany

[73] Assignee: Deutsche Thompson-Brandt GmbH, Villingen-Schwenningen, Fed. Rep. of Germany

[21] Appl. No.: 686,649

[22] Filed: Dec. 27, 1984

[30] Foreign Application Priority Data

Dec. 27, 1983 [DE] Fed. Rep. of Germany ....... 3347132

[51] Int. Cl.⁵ ................................................ H03J 7/08
[52] U.S. Cl. .................................. 358/191.1; 455/183
[58] Field of Search .......................... 358/191.1, 195.1; 455/200, 183, 197, 340

[56] References Cited

U.S. PATENT DOCUMENTS 4,334,323 6/1982 Moore ................................. 455/179
4,590,611 5/1986 Maier et al. ..................... 455/183 X

FOREIGN PATENT DOCUMENTS 2854852 7/1980 Fed. Rep. of Germany .
3242430 5/1983 Fed. Rep. of Germany .

OTHER PUBLICATIONS

Klank, AM–Spezialempfänger für den Frequenzbereich O,15–30 MHz, 1968, pp. 773–776.
Hasselt, IC–FM–Empfänger mit dem CA 3089, Oct. 1972, pp. 1035–1039.

Primary Examiner—James J. Groody
Assistant Examiner—Mark R. Powell
Attorney, Agent, or Firm—Horst M. Kasper

[57] ABSTRACT

The individual radio frequency filters are balanced successively by application of an auxiliary frequency at the antenna input. The auxiliary frequency is disposed between the frequency of the picture carrier and the sound carrier of the selected channel. The resulting intermediate frequency is disposed in the intermediate frequency region between the picture and sound intermediate frequency. The measurement voltage is picked up at the automatic gain control output of the radio frequency amplifier. The reference circuit is switched with regard to its frequency to the intermediate frequency during the balancing. The capacitance at the automatic gain control output is decreased during that time.

17 Claims, 2 Drawing Sheets

AUTOMATIC BALANCING SYSTEM FOR COMMUNICATIONS RECEIVER APPARATUS

BACKGROUND OF THE INVENTION

1. The invention relates to an electronic tuning system for communications apparatus, and in particular for television and radio receivers which employ a phase locked loop (PLL) system for the setting tuner oscillator of the receiver apparatus, which, with the aid of an auxiliary oscillator successively balances during the tuning of the receiver apparatus the individual tuning circuits to optimal values and which coordinate the determined adjustment.

2. Brief Description of the Background of the Invention Including Prior Art

Such a tuning unit is described for example, in German Patent Application Laid Open DE-OS No. 2,854,852, where three auxiliary oscillators are employed and connected to coordinated analog storage units, where phase locked loops are employed to tune the high frequency and radio frequency circuits to the desired receiver frequency. In this tuning unit the tuner oscillator is employed for the balancing. Furthermore, the number of auxiliary oscillators required corresponds to the number of high frequency and radio frequency circuits to be tuned. The number of the required auxiliary oscillators and thus the material requirements are then increased in a particular amount if, for example during the balancing of a television receiver, the band I, the band III and the bands IV and V have to be balanced. Here the danger exists of ambiguities between the frequencies of the tuner oscillator, the auxiliary oscillators and the receiver frequencies. It is disadvantageous for a practical realization of the proposed tuning unit of the reference that the exciter coils of the auxiliary oscillators can cause undesired resonances with the individual coils in the high frequency circuits and that damping of the circuits can be produced. In addition, an uncontrolled detuning can be caused if the auxiliary oscillators are switched off after the balancing has been performed. In addition, analog storage units are provided, which storage units have to be recharged at certain time intervals in order to maintain the optimum tuning values. For these reasons it is in principle not possible to have an optimal balancing of such a receiver apparatus. Also, the continuously repeating adjustments can become visible or, respectively, audible as interferences on the picture screen or the loud speaker.

A tuning method for radio receivers is taught in the journal "Nachrichten Elektronik" Issue 11-79, pp. 365-368, which also employs additional auxiliary circuits in the high frequency filters. There here results disadvantageous influences on the circuits during the operation of the balanced receiver. As set forth on p. 367, left and center column, the accuracy of the tuning is achieved by special components only in the form of exactly paired diodes. This requires equipment expenditures which can not be neglected.

There is also known a test system for a receiver from U.S. Pat. No. 3,736,512, which tests during on-line operation the properties of the individual stages of the receiver such as, for example, the pre-amplifier, the mixing stage, the radio frequency amplifier. In the case of deviations from the set points which are indicated by optical means, these have to be corrected by the operator of the receiver apparatus. The system taught is not a balancing system closed in itself where the radio frequency filtering circuits are balanced automatically to an optimum value for each receiver channel.

SUMMARY OF THE INVENTION

1. Purposes of the Invention

It is an object of the present invention to provide a tuning system for a communications apparatus which upon selection of a channel balances fully automatically the communications receiver apparatus. It is a further object of the present invention to provide communications receiver apparatus where the radio frequency filters are automatically adjusted to optimum values. It is a further object of the present invention to provide communications receiver apparatus where the intermediate frequency components are used to the fullest extent of their capability.

These and other objects and advantages of the present invention will become evident from the description which follows.

2. BRIEF DESCRIPTION OF THE INVENTION

The present invention provides an automatic balancing circuit for a communications receiver apparatus such as a color television receiver set. The automatic balancing circuit comprises a phase locked loop circuit and a tuning oscillator connected to the phase locked loop circuit and adjustable to it. An antenna having an output is connected to a tuner. An intermediate frequency component device which is fed with signals originating in the tuner, serves as an evaluation circuit during the automatic balancing process and has an output. An automatic gain control circuit AGC has an input connected to the output of the intermediate frequency component and an output providing a measurement voltage. A sample-and-hold circuit has an input connected to the output of the automatic gain control circuit and an output connected to an input of a microprocessor. A reference oscillator circuit required for a synchronous demodulator is comprised in the intermediate component device and is connected to the intermediate frequency component device. The reference oscillator circuit is controlled by the microprocessor during the automatic balancing process and switched in its resonance frequency to a frequency, which corresponds to the arithmetical average value of intermediate picture carrier frequency and intermediate sound carrier frequency.

An auxiliary oscillator can be connected to the antenna output during the automatic balancing for balancing the individual radio frequency tuning circuits sequentially to a maximum tuning voltage. The auxiliary oscillator can be employed with a frequency obtained from the difference of the set tuner oscillator frequency and the arithmetical average value of the intermediate picture carrier frequency and of the intermediate sound carrier frequency.

The automatic balancing circuit can further comprise capacitance tuning diodes disposed in radio frequency filter circuits and controlled by the microprocessor with tuning voltage values in digital steps, where the increase of the tuning voltage values is interrupted at the output upon finding of a maximum value with an evaluation circuit.

A capacitor can be disposed at the output of the automatic gain control circuit, which capacitor is switched to a smaller value under control of the microprocessor.

The automatic balancing circuit can further comprise a digital to analog converter having an input connected to an output of the microprocessor and having an output connected to the tuner. A channel selector can be connected to an output section of the tuner. A band pass filter can be connected to an output of the tuner and to an input of the intermediate frequency component device.

The automatic balancing circuit can further comprise a mixing stage connected to the output of an auxiliary oscillator and to an output of a channel selector and having an output connected to an input of the tuner. A switch connected to an output of the microprocessor can control the operation of the mixer stage. A switching stage can be connected to an output of the microprocessor to control a timing capacitor associated with the automatic gain control circuit. A switching stage can be controlled by the microprocessor and be connected to the reference oscillator circuit such that a capacitance can be connected in parallel with the oscillating circuit. There can be provided a connection between the microprocessor and the phase locked loop circuit to provide digital control of the phase locked loop circuit.

According to a further aspect, the present invention provides a method for automatic balancing of communication signals in a communications receiver apparatus such as television receiver apparatus which comprises feeding an input signal to a tuner, adjusting the tuner with a phase locked loop circuit, switching on an auxiliary frequency at an antenna input point during the automatic balancing process, balancing the individual radio frequency tuner circuits sequentially to a maximum output voltage, feeding an output of the tuner circuit to an intermediate frequency component, employing an intermediate frequency component device as an evaluation circuit during an automatic balancing process, feeding an output of the intermediate frequency component device to an automatic gain control circuit, feeding a measurement voltage at an output of the automatic gain control circuit to a sample-and-hold circuit, feeding the output of the sample-and-hold circuit to a following microprocessor, controlling during the automatic balancing process a reference oscillator circuit required for a synchronous demodulator contained in the intermediate frequency component device and connected to the intermediate frequency component device, and switching the reference oscillator circuit with its resonance frequency to a frequency which corresponds to the arithmetical average value of the intermediate picture carrier frequency and of the intermediate sound carrier frequency.

In the above method for automatic balancing of communication signals in a communications receiver apparatus, tuning voltage values can be applied to capacitance tuning diodes disposed in radio frequency filter circuits controlled by a microprocessor in digital steps. An increase of the tuning voltage values can be interrupted upon reaching of a maximum value fixed by an evaluation circuit. A frequency which results from the difference of the set tuner oscillator frequency and the arithmetic average value of the intermediate picture carrier frequency and the intermediate sound carrier frequency can be employed as an auxiliary oscillator frequency.

The method for automatic balancing of communication signals in a communications receiver apparatus can further comprise controlling the capacitor connected during the balancing process to the automatic gain control circuit with the microprocessor and switching the capacitance to a lower value.

Thus the invention is associated with the advantage that by employing the integrated intermediate frequency components already present in the communications receiver, where a typical amplification of 60 db. is feasible even for lowest levels of the auxiliary oscillator frequency and thus an exact evaluation of the measurement voltage becomes possible. This construction saves costs while providing highest sensitivity of an automatic balancing. Because of the low level of the auxiliary oscillator frequency at the antenna input, the requirements of various postal authorities and/or the Federal Communications Commission are assuredly met relative to the emission of interfering radiation.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
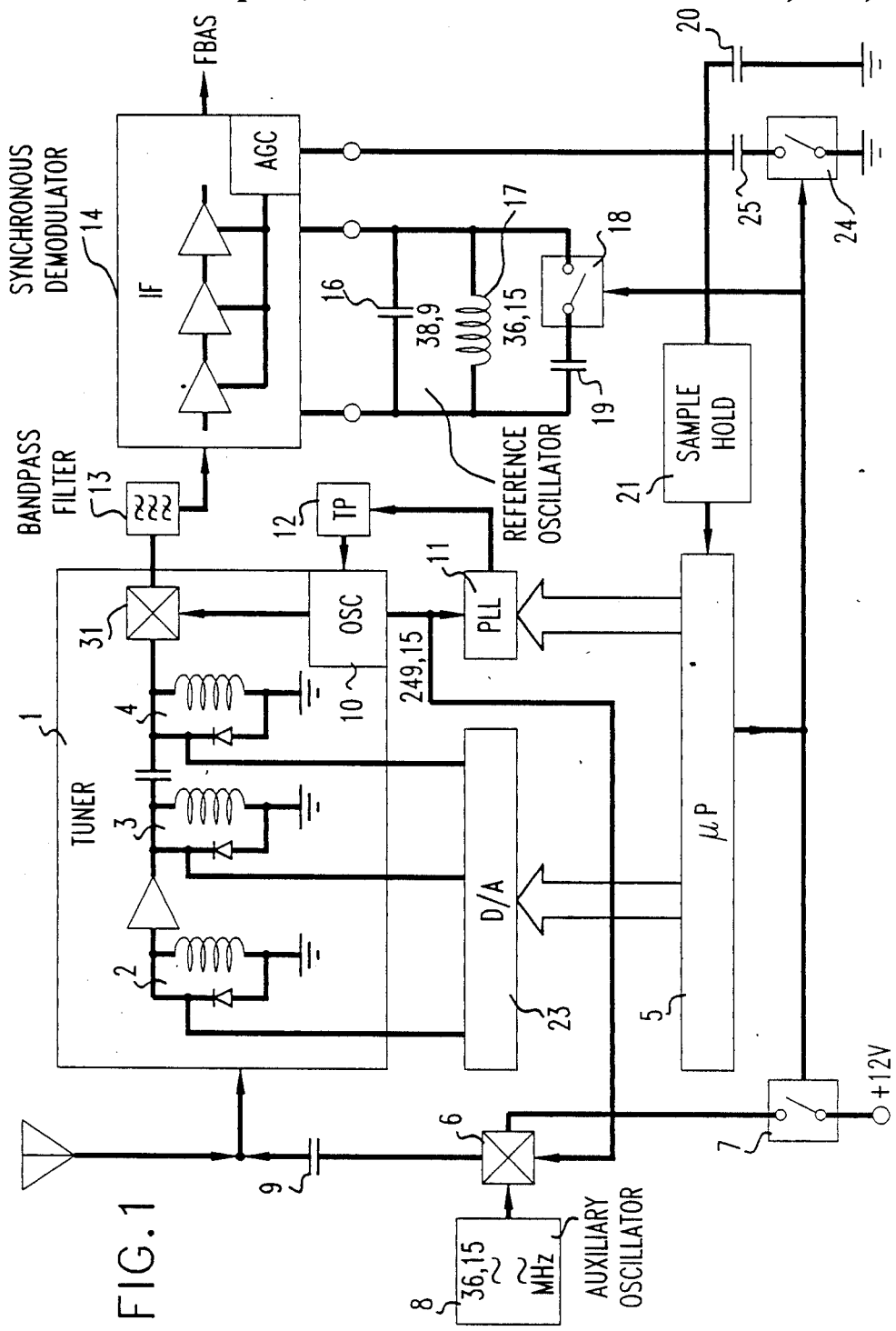
FIG. 1 illustrates in a block circuit diagram the main device groups required for the automatic balancing system.

In accordance with the present invention, there is provided an automatically operated balancing system for communications receivers and in particular for television receivers which employ a phase locked loop adjustable tuner oscillator, where during the automatic balancing an auxiliary frequency is applied to the antenna input and where the individual radio frequency tuning circuits are balanced successively to a maximum output voltage. Tuning voltage values are controlled by a microprocessor and are applied sequentially in digital steps to the tuning capacitance diodes present in the radio frequency filter circuits. The increase of the tuning voltage values upon reaching of a maximum value fixed by an evaluation circuit is interrupted at the output. The frequency is selected for an auxiliary oscillator frequency which results from the difference of the set tuner-oscillator frequency and the arithmetic average (median) value of the radio frequency image carrier frequency and radio frequency sound carrier frequency. During the automatic balancing process the intermediate frequency component device 14 is employed as an evaluation circuit by applying the measurement voltage of a sample and hold circuit 21 with a following microprocessor to the output for the automatic gain control circuit (AGC). During the automatic balancing process the microprocessor 5 controls the reference oscillator circuits 15 connected to the intermediate frequency component device 14 for the synchronous demodulator contained in the intermediate frequency device component at its resonance frequency to a frequency which corresponds to the arithmetic average of the intermediate frequency picture carrier frequency and the intermediate frequency sound carrier frequency.

The capacitor 25 connected during the balancing process to the automatic gain control output of the intermediate frequency component device 14 is controlled by a microprocessor 5 and switched to a smaller value.

Referring now to FIG. 1, there is shown a tuner circuit for a communications receiver apparatus, which tuner circuit is designated as 1 and the radio frequency filter circuits 2, 3, 4 of the tuner circuit are to be balanced automatically. Capacitance tuning diodes are disposed in the radio frequency filter circuits 2, 3, 4 and corresponding tuning direct current voltages are applied to these capacitance tuning diodes. During the automatic balancing a mixing stage 6 is connected via switching stage 7 and controlled by a microprocessor 5. The mixing stage generates with the aid of an auxiliary oscillator 8 a characteristic frequency which is applied to the antenna input of the tuner 1 via the capacitor 9. The auxiliary frequency generated by the mixing stage 6 results from the oscillator frequency $f_{osc}$ of the tuner oscillator which is controlled by a phase locked loop PLL 11, 12 and by the frequency of an auxiliary oscillator 8 as a difference frequency from $f_{osc}$ - auxiliary. .This frequency, for example, is disposed in the television system of the Federal Republic of Germany in this case always between the radio frequency picture and the radio frequency sound carriers. Thus there results for example upon selecting of the channel 10 in the band 3 of the television receiver frequency range a characteristic frequency of 213 megahertz in the case of an adjusted oscillator frequency of 249.15 megahertz of the tuner oscillator 1.

The characteristic frequency of 213 megahertz together with the oscillator frequency of 249.15 megahertz results in an intermediate frequency of 36.15 megahertz of the output of the tuner 1. The tuner 1 contains a mixing stage 31 which has an input connected to the radio filter circuit 4 and a second input connected to the oscillator 10 which has an output connected to the band pass filter 13. This intermediate frequency is disposed in the center of the band of the intermediate frequency channel and passes via a band pass filter 13 to the intermediate frequency component device 14 present in the receiver apparatus. This component device 14 comprises a synchronous demodulator, for which the reference frequency is generated in a reference oscillator circuit 15 connected from the outside. The reference oscillator circuit comprises the capacitor 16 and coil 17 and is tuned to 38.9 megahertz corresponding to the regular receiver situation of the picture intermediate frequency carrier.

During the automatic balancing the reference oscillator circuit 15 is controlled by the microprocessor 5 and is switched to a lower reference frequency of 36.15 megahertz, where a capacitor 19 is connected in parallel via the switching stage 18.

A measurement voltage is picked up at the automatic gain control (AGC) output of the intermediate frequency stage 14 at the capacitor 20, which voltage is converted via a sample and hold circuit 21 and then fed to the microprocessor which increases the tuning voltage for such time until a maximum of the measurement voltage is achieved at the automatic gain control (AGC) output.

A sample and hold circuit accepts an input signal and adds sampling or interrogating pulses to it. It then sends samples through its output and holds in its memory the amplitude of the previous sample. Sampling circuits can have various configurations and such circuits have been published for example by the Tektronix Company.

The microprocessor increases the tuning voltage via the digital to analog converter 23 in stages until the sample and hold circuit displays an optimum balancing. A digital word is stored for this optimum balancing. The other circuits are controlled in the same manner by the microprocessor 5 and are balanced and tuned successively. During the automatic balancing decrease of the time constant of the automatic amplification control is required. This is achieved by switching off the capacitor 25 necessary for large time constant via the switching stage 24.

Figure 2:
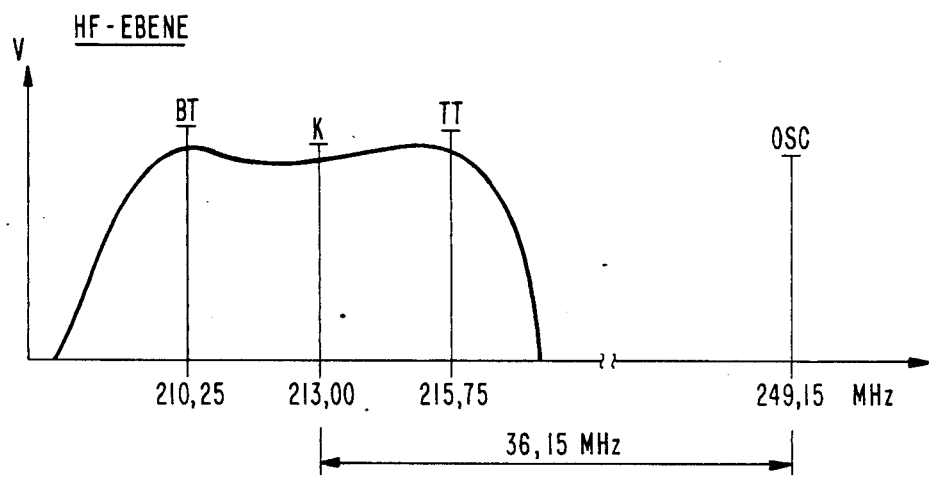
FIG. 2 is a schematic view of a voltage versus frequency diagram showing the operation of the circuit of FIG. 1.

The frequency position of the generated characteristic frequency k is generated as shown in FIG. 2. This is explained in the following by way of the example of the channel 10 in the Federal Republic of Germany.

After selection of channel 10, the tuner oscillator frequency of 249.15 megahertz is adjusted. The picture carrier of the receiver signal is disposed at 210.25 megahertz and the sound carrier at 215.75 megahertz. A characteristic frequency k is generated and is disposed between the picture carrier and the sound carrier and is lower by 36.15 megahertz than the so adjusted oscillator frequency. This frequency k also represents the difference of $f_{osc}$ and of 36.15 megahertz.

Figure 3:
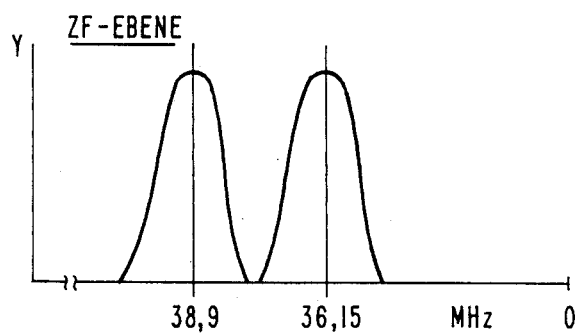
FIG. 3 is a view of a diagram showing the switching over of a reference circuit from a resonance frequency of 38.9 megahertz to 36.15 megahertz.

The reference circuit 15 can be switched from its resonance frequency 38.9 megahertz to a frequency of 36.15 megahertz as is shown in FIG. 3.

Figure 4:
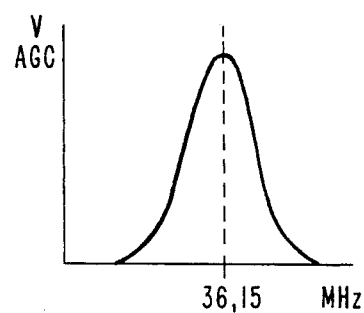
FIG. 4 is a view of the course of the automatic gain control voltage corresponding to the view shown in FIG. 3.

The course of the automatic gain control voltage is shown in FIG. 4, which is an accurate image of the results of the reference circuit according to FIG. 3.

It will be understood that each of the elements described above, or two or more together, may also find a useful application in other types of system configurations and automatic balancing procedures differing from the types described above While the invention has been illustrated and described as embodied in the context of a automatic balancing system for communications receiver apparatus, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claim;

1. An automatic balancing circuit for a communications receiver apparatus such as a color television receiver set comprising
   a phase locked loop circuit;

a tuning oscillator connected to the phase locked loop circuit and adjustable to the phase locked loop circuit;

an antenna having an output;

a tuner connected to the antenna;

an intermediate frequency component device fed with signals originating in the tuner and serving as an evaluation circuit during the automatic balancing process and having an output;

an automatic gain control circuit AGC having an input connected to the output of the intermediate frequency component and having an output providing a measurement voltage;

a sample-and-hold circuit having an input connected to the output of the automatic gain control circuit and having an output;

a microprocessor having an input connected to the output of the sample-and-hold circuit;

a reference oscillator circuit required for a synchronous demodulator comprised in an intermediate component device and connected to the intermediate frequency component device, which reference oscillator circuit is controlled by the microprocessor during the automatic balancing process and switched in its resonance frequency to a frequency, which corresponds to an arithmetical average value of intermediate picture carrier frequency and intermediate sound carrier frequency.

2. The automatic balancing circuit for a communications receiver apparatus according to claim 1 further comprising
an auxiliary oscillator connected to the antenna output during the automatic balancing for balancing individual radio frequency tuning circuits sequentially to a maximum tuning voltage.

3. The automatic balancing circuit for a communications receiver apparatus according to claim 1 further comprising
capacitance tuning diodes disposed in radio frequency filter circuits of the tuner and controlled by the microprocessor with tuning voltage values in digital steps, where the increasing of the tuning voltage values is interrupted at the output upon finding of a maximum value with an evaluation circuit.

4. The automatic balancing circuit for a communications receiver apparatus according to claim 1 wherein an auxiliary oscillator is employed with a frequency obtained from the difference of the set tuner oscillator frequency and the arithmetical average value of the intermediate picture carrier frequency and of the intermediate sound carrier frequency.

5. The automatic balancing circuit for a communications receiver apparatus according to claim 1 further comprising
a capacitor disposed at the output of the automatic gain control circuit, which capacitor is switched to a smaller value under control of the microprocessor.

6. The automatic balancing circuit for a communications receiver apparatus according to claim 1 further comprising
a digital to analog converter having an input connected to an output of the microprocessor and having an output connected to the tuner.

7. The automatic balancing circuit for a communications receiver apparatus according to claim 1 further comprising
a channel selector connected to an output section of the tuner.

8. The automatic balancing circuit for a communications receiver apparatus according to claim 1 further comprising
a band pass filter connected to an output of the tuner and to an input of the intermediate frequency component device.

9. The automatic balancing circuit for a communications receiver apparatus according to claim 1 further comprising
a mixing stage connected to the output of an auxiliary oscillator and to an output of a channel selector and having an output connected to an input of the tuner.

10. The automatic balancing circuit for a communications receiver apparatus according to claim 9 further comprising
a switch connected to an output of the microprocessor and controlling the operation of the mixer stage.

11. The automatic balancing circuit for a communications receiver apparatus according to claim 9 further comprising
a switching stage connected to an output of the microprocessor and controlling a timing capacitor associated with the automatic gain control circuit.

12. The automatic balancing circuit for a communications receiver apparatus according to claim 1 further comprising
a switching stage controlled by the microprocessor and connected to the reference oscillator circuit such that a capacitance can be connected in parallel with the oscillating circuit.

13. The automatic balancing circuit for a communications receiver apparatus according to claim 1 further comprising
a connection between the microprocessor and the phase locked loop circuit to provide digital control of the phase locked loop circuit.

14. A method for automatic balancing of communication signals in a communications receiver apparatus such as television receiver apparatus comprising
feeding an input signal to a tuner;
adjusting the tuner with a phase locked loop circuit;
switching on an auxiliary frequency at an antenna input point during the automatic balancing process;
balancing individual radio frequency tuner circuits of the tuner sequentially to a maximum output voltage;
feeding an output of the tuner circuit to an intermediate frequency component;
employing an intermediate frequency component device as an evaluation circuit during an automatic balancing process;
feeding an output of the intermediate frequency component device to an automatic gain control circuit;
feeding a measurement voltage at an output of the automatic gain control circuit to a sample-and-hold circuit;
feeding the output of the sample-and-hold circuit to a following microprocessor;
controlling during the automatic balancing process a reference oscillator circuit required for a synchronous demodulator contained in the intermediate frequency component device and connected to the intermediate frequency component device; and switching the reference oscillator circuit with its resonance frequency to a frequency which corresponds to the arithmetical average value of an intermediate picture carrier frequency and of an intermediate sound carrier frequency.

15. A method for automatic balancing of communication signals in a communications receiver apparatus according to claim 14 further comprising
   applying tuning voltage values to capacitance tuning diodes disposed in radio frequency filter circuits controlled by a microprocessor in digital steps.

16. A method for automatic balancing of communication signals in a communications receiver apparatus according to claim 15 further comprising interrupting an increase of the tuning voltage valves upon reaching of a maximum value fixed by an evaluation circuit; employing as an auxiliary oscillator frequency, a frequency which results from the difference of a set tuner oscillator frequency and the arithmetic average value of the intermediate picture frequency and the intermediate sound carrier frequency.

17. A method for automatic balancing of communication signals in the communications receiver apparatus according to claim 15 further comprising
   controlling a capacitor connected during the balancing process to the automatic gain control circuit with the microprocessor; and
   switching the capacitance to a lower value.

* * * * *